United States Patent
Irie et al.

(10) Patent No.: US 9,549,462 B2
(45) Date of Patent: Jan. 17, 2017

(54) CONDUCTIVE FILM SUBSTRATE, TRANSPARENT CONDUCTIVE FILM, AND METHOD FOR PRODUCING TRANSPARENT CONDUCTIVE FILM

(71) Applicant: KANEKA CORPORATION, Osaka-shi, Osaka (JP)

(72) Inventors: Tooru Irie, Settsu (JP); Takahisa Fujimoto, Settsu (JP); Takashi Kuchiyama, Settsu (JP); Hironori Hayakawa, Otsu (JP); Shinya Omoto, Settsu (JP); Kenji Yamamoto, Settsu (JP)

(73) Assignee: KANEKA CORPORATION, Osaka-shi (JP)

( * ) Notice: Subject to any disclaimer, the term of this patent is extended or adjusted under 35 U.S.C. 154(b) by 0 days.

(21) Appl. No.: 14/780,529

(22) PCT Filed: Mar. 3, 2014

(86) PCT No.: PCT/JP2014/055292
§ 371 (c)(1),
(2) Date: Sep. 26, 2015

(87) PCT Pub. No.: WO2014/156489
PCT Pub. Date: Oct. 2, 2014

(65) Prior Publication Data
US 2016/0044778 A1   Feb. 11, 2016

(30) Foreign Application Priority Data

Mar. 26, 2013 (JP) .................................. 2013-063937
Apr. 18, 2013 (JP) .................................. 2013-087389

(51) Int. Cl.
*H05K 1/09* (2006.01)
*H05K 1/02* (2006.01)
(Continued)

(52) U.S. Cl.
CPC ............. *H05K 1/0274* (2013.01); *G06F 3/044* (2013.01); *H05K 1/0296* (2013.01);
(Continued)

(58) Field of Classification Search
CPC .... H05K 1/0274; H05K 1/0296; H05K 3/067; H05K 3/227; G06F 3/044; G06F 2203/04103
(Continued)

(56) References Cited

U.S. PATENT DOCUMENTS

2001/0019301 A1   9/2001  Shibuya et al.
2002/0030577 A1   3/2002  Shibuya et al.
(Continued)

FOREIGN PATENT DOCUMENTS

JP   200013016 A   1/2000
JP   2006134994 A   5/2006
(Continued)

OTHER PUBLICATIONS

International Bureau of WIPO, International Preliminary Report on Patentability Issued in Application No. PCT/JP2014/055292, Oct. 8, 2015, WIPO, 6 pages.
(Continued)

*Primary Examiner* — Tremesha S Willis
(74) *Attorney, Agent, or Firm* — Alleman Hall McCoy Russell & Tuttle LLP

(57) ABSTRACT

Provided is a transparent conductive film including a transparent electrode layer composed of a patterned thin metal wire on at least one surface of a transparent film substrate. The line width of the wire is 5 μm or less. The wire includes a first metal layer and a second metal layer that is in contact with the first metal layer, in this order from a transparent film substrate side. Both of the first and second metal layers contain copper in an amount of 90% by weight or more. The
(Continued)

total film thickness of the first and second metal layers is 150 to 1000 nm. The diffraction angle 2θ of the (111) plane of the second metal layer is less than 43.400° as measured using a CuKα ray as an X-ray source, and the first metal layer has crystal properties different from those of the second metal layer.

17 Claims, 5 Drawing Sheets

(51) Int. Cl.
    *G06F 3/044*     (2006.01)
    *H05K 1/03*     (2006.01)
    *H05K 3/00*     (2006.01)
    *H05K 3/06*     (2006.01)
    *H05K 3/22*     (2006.01)

(52) U.S. Cl.
    CPC ............. *H05K 1/0326* (2013.01); *H05K 1/09* (2013.01); *H05K 3/0064* (2013.01); *H05K 3/067* (2013.01); *H05K 3/227* (2013.01); *G06F 2203/04103* (2013.01); *G06F 2203/04112* (2013.01); *H05K 2201/0108* (2013.01); *H05K 2201/0145* (2013.01)

(58) Field of Classification Search
    USPC .................. 174/250, 251, 253, 255–257
    See application file for complete search history.

(56) References Cited

U.S. PATENT DOCUMENTS

| | | |
|---|---|---|
| 2004/0231141 A1 | 11/2004 | Nishinaka et al. |
| 2011/0198117 A1 | 8/2011 | Watanabe et al. |

FOREIGN PATENT DOCUMENTS

| | | |
|---|---|---|
| JP | 2012053644 A | 3/2012 |
| JP | 2012079238 A | 4/2012 |
| WO | 03004262 A1 | 1/2003 |
| WO | 2010024175 A1 | 3/2010 |

OTHER PUBLICATIONS

ISA Japanese Patent Office, International Search Report Issued in Application No. PCT/JP2014/055292, May 13, 2014, WIPO, 2 pages.

CONDUCTIVE FILM SUBSTRATE, TRANSPARENT CONDUCTIVE FILM, AND METHOD FOR PRODUCING TRANSPARENT CONDUCTIVE FILM

TECHNICAL FIELD

The present invention relates to a transparent conductive film including a transparent electrode layer formed of a metal layer patterned into thin wire on a transparent film substrate, and a method for producing the transparent conductive film. The present invention also relates to a conductive film substrate used for manufacturing the transparent conductive film. In addition, the present invention relates to a touch panel including the transparent conductive film.

BACKGROUND ART

A transparent conductive film including a transparent electrode on a transparent film substrate is used in various fields such as solar cells, light-emitting elements, display devices, and touch panels. As transparent electrode materials, those containing indium oxide as a main component, such as indium-tin composite oxide (ITO) and indium-zinc composite oxide (IZO) are widely used because they have high transparency, low resistivity, and high reliability. However, with respect to the conductive oxide containing indium oxide as a main component such as ITO, an essential raw material thereof, i.e., indium, is an expensive rare metal, and there is concern about resource exhaustion. A conductive oxide has higher resistivity than metallic materials, and therefore has a problem that the transmission speed of a current between electrodes is low, so that the response speed becomes low as the device area is increased.

In view of the problems related to conductive metal oxides as described above, attempts have been made in recent years to use a patterned thin wire metallic material as a transparent electrode. For example, Patent Document 1 discloses a transparent conductive film including patterned thin metal wire composed of a silver halide photographic sensitive material, a silver nanowire, or the like, on a transparent base. However, silver is an expensive material, and is easily visible even when formed into a thin wire because it has a high metallic reflectance. Accordingly, it has been necessary to develop a transparent electrode including a thin metal wire made of copper as a material which has a lower metallic reflection and is less expensive and more versatile as compared to silver, and is also excellent in conductivity.

In the field of flexible printed wiring boards, a method has been put into practical use in which a copper wiring is formed on a polyimide film substrate by a photolithography method (e.g., Patent Document 2). Since a polyimide has a large dielectric loss tangent, and a large transmission loss in a high frequency region, an attempt has been made to form a copper wiring on a transparent plastic film substrate such as liquid crystal polymer or a thermoplastic cycloolefin (e.g., Patent Document 3).

PRIOR ART DOCUMENTS

Patent Documents

Patent Document 1: JP-A-2012-53644
Patent Document 2: WO 2003/004262
Patent Document 3: WO 2010/024175

SUMMARY OF THE INVENTION

Problems to be Solved by the Invention

In the copper wiring in the printed wiring board, the width of the line/space of the wiring is generally about 20 µm or more from the viewpoint of reducing the resistance of the wiring and reducing noises. On the other hand, in the transparent conductive film, it is required that the metal wire not be visible. Particularly, a display including a touch panel is viewed at a distance of about 10 cm to several tens of centimeters from a screen, and therefore the metal line width should be 5 µm or less for ensuring that a metal wire that forms a transparent electrode layer is hardly visible.

In formation of a metal wiring by a photolithography method, a resist pattern is formed on a metal layer, and a region of the metal layer which is not covered with a resist is removed by wet etching. When the line width of the thin metal wire is lessened to 5 µm or less, influences of "side etching" in which etching progresses even at a metal wiring section immediately below the resist-covered region becomes significant, so that an increase in resistance and line breakage easily occur. As mentioned in Patent Document 3, it is not easy to adhere copper onto a transparent film, and peeling of a copper layer (copper wiring) from a film substrate may occur during handling in a process for producing a transparent electrode or during patterning of a metal layer.

Thus, formation of a transparent conductive film including a transparent electrode layer composed of a patterned thin copper wire on a transparent film substrate has a problem in regard to adhesion between the film substrate and the metal and formation of a thin wire, while the problem is not encountered in formation of a wiring pattern on a flexible printed board, which is not required to have light permeability. In view of these problems, an object of the present invention is to provide a conductive film substrate which includes a copper layer on a transparent film substrate and in which copper can be formed into a thin wire. Another object of the present invention is to provide a transparent conductive film including a transparent electrode layer composed of a patterned thin copper wire on a transparent film substrate.

Means for Solving the Problems

The present inventors have conducted studies, and as a resultant, found that the above-mentioned problems can be solved when a transparent film with a surface composed of a polyester-based resin or a Ni layer is provided as an underlay and two copper thin films are formed thereon, thus leading to the present invention. The present invention relates to a transparent conductive film including a transparent electrode layer composed of a patterned thin metal wire on at least one surface of a transparent film substrate, wherein the patterned thin metal wire contains copper as a main component and has a line width of 5 µm or less. The present invention also relates to a conductive film substrate that is used for production of the transparent conductive film.

A conductive film substrate according to one aspect of the present invention includes on at least one surface of a transparent film substrate a first metal layer that is in contact with the transparent film substrate and a second metal layer that is in contact with the first metal layer. At least a surface of the transparent film substrate, which is in contact with the first metal layer, contains a polyester-based resin as a main component.

A conductive film substrate according to another aspect of the present invention includes on at least one surface of a transparent film substrate an underlying metal layer containing Ni as a main component, a first metal layer that is in contact with the underlying metal layer, and a second metal layer that is in contact with the first metal layer in this order.

Further, the present invention relates to a transparent conductive film that is produced using the conductive film. The transparent conductive film of the present invention includes a transparent electrode layer composed of a patterned thin metal wire on at least one surface of a transparent film substrate, wherein the thin metal wire has a line width of 5 μm or less.

In the conductive film substrate and the transparent conductive film according to the present invention, the first metal layer and the second metal layer each contain copper in an amount of 90% by weight or more. The total thickness of the first metal layer and the second metal layer is preferably 150 nm to 1000 nm.

Preferably, the first metal layer and the second metal layer have mutually different crystal properties. For example, when the first metal layer and the second metal layer are formed by different deposition methods, metal layers having different crystal properties are obtained. Having different crystal properties refers to, for example, a case where there is a difference in a diffraction peak angle or diffraction peak intensity of a (111) plane, a (200) plane, a (220) plane, or the like, in X-ray diffraction.

In the present invention, it is preferred that the first metal layer is formed by a dry coating method, and the second metal layer is formed by a wet plating method. Particularly, it is preferred that the first metal layer is formed by a sputtering method, and the second metal layer is formed by an electroplating method.

The diffraction angle 2θ of the (111) plane in the second metal layer as measured using a CuKα ray as an X-ray source is preferably less than 43.400°. The diffraction angle 2θ of the (111) plane in the first metal layer as measured using a CuKα ray as an X-ray source is preferably larger than the diffraction angle 2θ of the (111) plane in the second metal layer.

The thickness of the first metal layer is preferably smaller than the thickness of the second metal layer. The thickness of the first metal layer is preferably 10 to 200 nm.

A first mode of a method for producing a transparent conductive film includes: a first metal layer forming step of forming a first metal layer on a transparent film substrate by a dry coating method; a second metal layer forming step of forming a second metal layer directly on the first metal layer by an electroplating method; a resist forming step of forming a resist pattern on the second metal layer; a metal layer patterning step of removing regions of the first metal layer and the second metal layer, which are not covered with the resist pattern, by etching to form a patterned metal thin wire; and a resist removing step of removing the resist pattern. This mode corresponds to the so-called subtractive method.

In a mode where an underlying metal layer is provided on a transparent film substrate, a first metal layer is formed directly on the underlying metal layer after an underlying metal layer forming step of forming an underlying metal layer on the transparent film substrate by a dry coating method. In this case, in the metal layer patterning step, regions of the first metal layer and the second metal layer, and also the underlying metal layer, which are not covered with the resist pattern, are removed by etching (third mode).

A second mode of a method for producing a transparent conductive film includes: a first metal layer forming step of forming a first metal layer on a transparent film substrate by a dry coating method; a resist forming step of forming a resist pattern having an opening width of 5 μm or less on the first metal layer; a second metal layer forming step of forming a second metal layer directly on the first metal layer at an opening section, in which the resist pattern is not formed, by an electroplating method; a resist removing step of removing the resist pattern; and a first metal layer patterning step of removing the first metal layer at a region, on which the second metal layer is not formed, by etching to pattern the first metal layer. This mode corresponds to the so-called semi-additive method.

In a mode where an underlying metal layer is provided on a transparent film substrate, a first metal layer is formed after an underlying metal layer forming step of forming an underlying metal layer on the transparent film substrate by a dry coating method. In this case, in the first metal layer patterning step, the underlying metal layer, as well as the first metal layer, at a region on which the second metal layer is not formed, is removed by etching (fourth mode).

Effect of the Invention

According to the present invention, a first metal layer and a second metal layer are formed on a prescribed transparent film substrate or a prescribed underlying metal layer, and thus the adhesive strength between the transparent film substrate and the metal layer (thin metal wire) is improved. Further, side etching at the time of patterning the metal layer into a thin wire by wet etching is suppressed, so that a transparent conductive film is obtained, in which a patterned thin metal wire is hardly visible, and defects such as line breakage and an increase in resistance hardly occur.

DESCRIPTION OF EMBODIMENTS

[Configuration of Transparent Conductive Film]

Figure 1:
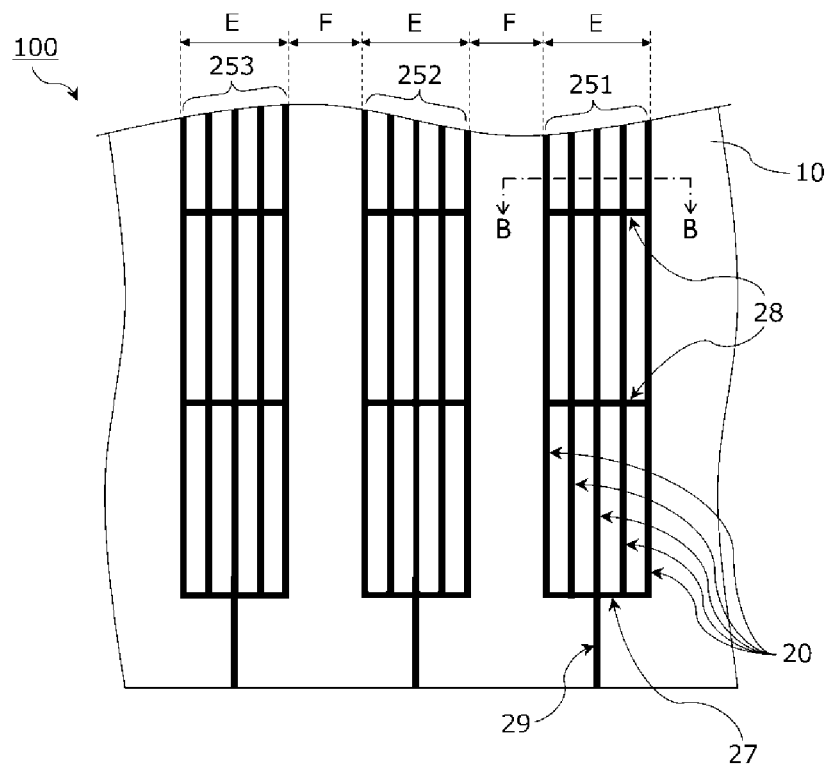
FIG. 1 is a plan view schematically showing one embodiment of a transparent conductive film.
Figure 2A:
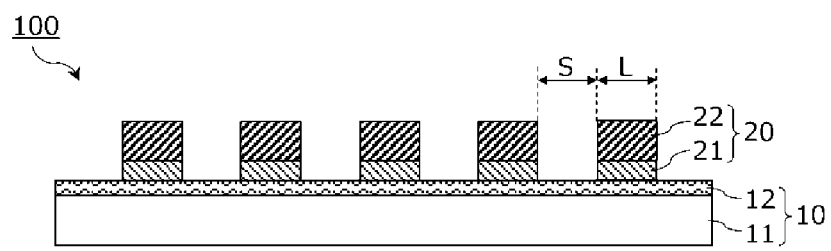
FIG. 2A is a sectional view schematically showing one embodiment of a transparent conductive film.
Figure 2B:
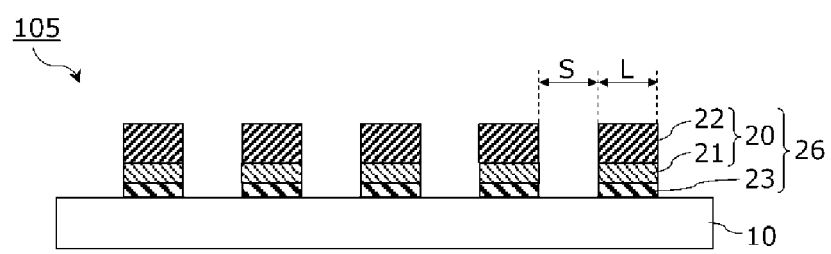
FIG. 2B is a sectional view schematically showing one embodiment of a transparent conductive film.

FIG. 1 is a plan view schematically showing one aspect of a transparent conductive film. FIGS. 2A and 2B are sectional views each schematically showing a cross section taken along the line II-II in FIG. 1. As shown in FIGS. 2A and 2B, a transparent conductive film 100 includes metal thin wires 20 and 26 on a transparent film substrate 10. The line width L of each of the metal thin wires 20 and 26 is preferably 5 μm or less, more preferably 3 μm or less. When the line width is 5 μm or less, the thin wire is hardly visible even when the transparent conductive film is used in a display which is viewed at a close distance like a position detecting electrode for a touch panel.

On the transparent film substrate 10, the plurality of metal thin wires 20 form a prescribed conductive pattern. In the example in FIG. 1, five metal thin wires 20 are connected to a drawing wire 29 via a connecting wire 27 to form one conductive pattern 251. In the example in FIG. 1, connecting wires 28 are provided in the conductive pattern 251 in case of a line breakage of the metal thin wires 20, etc. The connecting wire 27 and the drawing wire 29 are generally provided on a frame region that is outside the visible region of the display, and therefore may have a line width of more than 5 μm. On the other hand, a metal wire provided on the visible region, like the connecting wire 28, preferably has a line width of 5 μm or less as in the case of the metal thin wires 20.

The transparent conductive film 100 shown in FIG. 1 includes conductive pattern-formed sections E and conductive pattern-non-formed sections F, and conductive patterns 251 to 253 are formed within respective conductive pattern-formed sections E. When the transparent conductive film is used in a position detecting electrode for a capacitive touch panel, the line widths of the conductive pattern-formed section E and the conductive pattern-non-formed section F are each set to about 3 to 9 mm. When the line width of the conductive pattern-formed section E is small, the capacitance during detection of position may decrease to cause a misdetection. When the line width of the conductive pattern-formed section E or the line width of the conductive pattern-non-formed section F is excessively large, the position detection accuracy of the electrode tends to be reduced.

The number of the metal thin wires 20 to be connected to one drawing wire 29, and the distance between adjacent metal thin wires are determined by taking into consideration the position detection accuracy, the transmittance, and so on when the transparent conductive film is used in a touch panel. The opening ratio of the conductive pattern is preferably 97% or more, more preferably 98% or more for securing the transmittance.

The opening ratio is defined by the ratio of the total light transmittance of the conductive pattern-formed section E to the conductive pattern-non-formed section F on the transparent conductive film. The total light transmittance is measured in accordance with JIS K7375 using a turbidity meter.

Opening ratio (%)=100×(total light transmittance of conductive pattern-formed section)/(total light transmittance of conductive pattern-non-formed section)

The theoretical value of the opening ratio is calculated in accordance with the following equation using the line width L of the thin metal wire 20 and the distance S between adjacent metal thin wires.

Theoretical opening ratio (%)=100×S/(L+S)

When the line width of each of the metal thin wires 20 and 26 is 5 μm or less, and the opening ratio of the conductive pattern is 97% or more, a transparent conductive film having a conductive pattern which is hardly visible and having a high transmittance can be obtained. FIG. 1 illustrates a conductive pattern with the metal thin wires 20 and 26 arranged in parallel to one another, but the shape of the conductive pattern is not particularly limited as long as the opening ratio falls within the above-mentioned range. For example, the metal thin wires may form a mesh pattern that is in the form of a square lattice, a rhomboidal lattice, a honeycomb, or the like.

As shown in FIGS. 2A and 2B, in the transparent conductive film 100 of the present invention, the thin metal wires 20 and 26 each include a first metal layer 21 and a second metal layer 22 in this order from the transparent film substrate 10 side. In the aspect shown in FIG. 2B, the thin metal wire 26 further includes an underlying metal layer 23. When the metal layer that forms thin metal wires has such a multilayered structure, defects such as line breakage hardly occur during formation of a thin wire pattern, and adhesion between the transparent film substrate 10 and the thin metal wires 20 and 26 is improved even when the line width of each of the thin metal wires 20 and 26 is 5 μm or less. Hereinafter, materials that form the transparent conductive film, etc., will be described more in detail while showing a process for producing a transparent conductive film for the aspect shown in FIG. 2A, i.e., an aspect in which the first metal layer 21 is formed directly on the transparent film substrate 10 without interposition of an underlying metal layer therebetween.

[First Embodiment: Subtractive Method]

Figure 3:
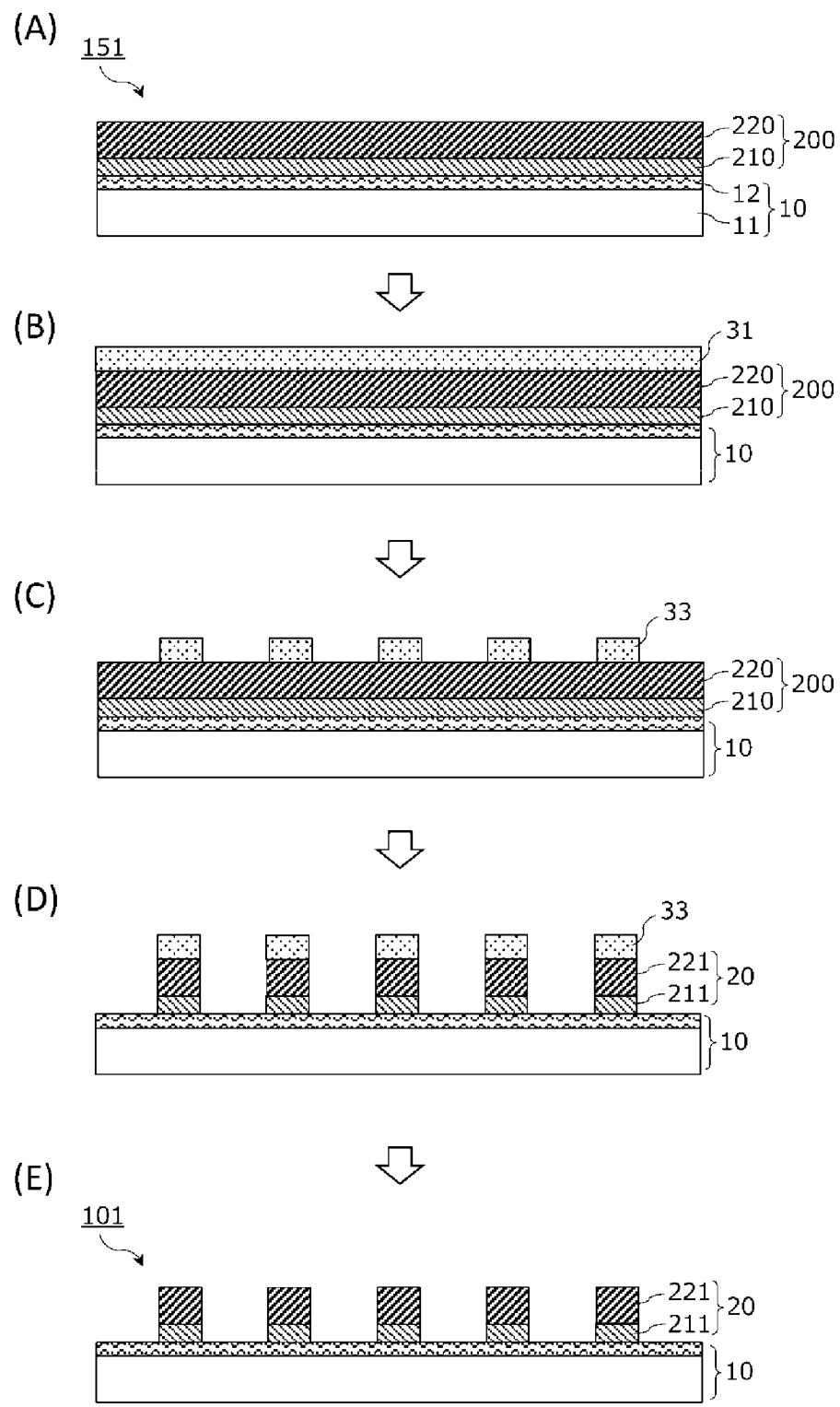
FIG. 3 is a conceptual view showing one embodiment of a process for producing a transparent conductive film.

FIG. 3 is a schematic conceptual view showing one example of a process for producing a transparent conductive film 101. In the aspect shown in FIG. 3, first, a metal layer 200 is formed on a transparent film substrate 10 to give a conductive film substrate 151 (FIG. 3 at (A)). Then, on the metal layer 200, a resist layer 31 is formed (FIG. 3 at (B)), and a resist pattern 33 is formed (FIG. 3 at (C)). Thereafter, a resist pattern-non-formed section the metal layer 200 is removed by wet etching to form a thin metal wire 20 (FIG. 3 at (D)). Finally, the resist pattern is removed to give the transparent conductive film 101 (FIG. 3 at (E)). The series of steps are substantially identical to the steps of a subtractive method in a technique for producing a printed wiring board.

<Conductive Film Substrate>

The conductive film substrate 151 includes the metal layer 200 on the transparent film substrate 10.

(Transparent Film Substrate)

As the transparent film substrate 10, one that is colorless and transparent in at least a visible light region is used. The total light transmittance of the transparent film substrate 10 is preferably 90% or more, more preferably 91% or more, further preferably 92% or more.

In the aspect shown in FIG. 2A, at least a surface of the transparent film substrate 10, which is in contact with the metal layer 200, contains a polyester-based resin as a main component. For example, mention is made of an aspect in which the whole of the transparent film substrate 10 is a film containing a polyester-based resin as a main component, or an aspect in which the transparent film substrate 10 includes, on a surface of a transparent film base 11, a functional layer 12 containing a polyester-based resin as a main component. When the surface of the transparent film substrate 10 on which the metal layer 200 is formed is composed of a polyester-based resin, adhesion between the transparent film substrate 10 and the metal layer 200 is improved. Further, at the time of forming the metal thin wires 20 by wet etching, the metal layer 200 formed on the transparent film substrate 10, side etching is suppressed, so that a satisfactory patterned thin wire is formed.

In the aspect in which the transparent film substrate 10 includes on a surface of the transparent film base 11 the functional layer 12 containing a polyester-based resin as a main component, a transparent resin such as a polyester resin such as polyethylene terephthalate (PET), polybutylene terephthalate (PBT) or polyethylene naphthalate (PEN), a cycloolefin-based resin, a polycarbonate resin, a cellulose-based resin, or polypropylene (PP) is suitably used as a material of the transparent film base 11.

As a material of the functional layer 12 containing a polyester-based resin as a main component, a polyester obtained by polycondensation of a polyvalent carboxylic acid (e.g., divalent, trivalent, or greater) and a diol component is suitably used. As the polyvalent carboxylic acid component, an aromatic, aliphatic or cycloaliphatic dicarboxylic acid, or a polyvalent carboxylic acid with a valence number of 3 or more can be used. As the aromatic dicarboxylic acid, terephthalic acid, isophthalic acid, orthophthalic acid, phthalic acid, 2,5-dimethylterephthalic acid, 1,4-naphthalenedicarboxylic acid, biphenyldicarboxylic acid, 2,6-naphthalenedicarboxylic acid, 1,2-bis-phenoxyethane-p,p'-dicarboxylic acid, phenylindanedicarboxylic acid, or the like can be used. As the aliphatic and cycloaliphatic dicarboxylic acids, succinic acid, adipic acid, sebacic acid, dodecanedioic acid, dimer acid, 1,3-cyclopentanedicarboxylic acid, 1,2-cyclohexanedicarboxylic acid, 1,4-cyclohexanedicarboxylic acid, and ester forming derivatives thereof can be used. Preferably, a compound containing a sulfonate group or a compound containing a carboxylate group is contained as a copolymerization component for the purpose of improving adhesion at the time of applying a polyester-based resin on a base as a water-soluble coating solution.

As the diol component, ethylene glycol, diethylene glycol, polyethylene glycol, propylene glycol, polypropylene glycol, 1,3-propanediol, 1,3-butanediol, 1,4-butanediol, 1,5-pentanediol, 1,6-hexanediol, 1,7-heptane diol, 1,8-octane diol, 1,9-nonanediol, 1,10-decanediol, 2,4-dimethyl-2-ethylhexane-1,3-diol, neopentyl glycol, 2-ethyl-2-butyl-1,3-propanediol, 2-ethyl-2-isobutyl-1,3-propanediol, 3-methyl-1,5-pentanediol, 2,2,4-trimethyl-1,6-hexanediol, 1,2-cyclohexanedimethanol, 1,3-cyclohexanedimethanol, 1,4-cyclohexanedimethanol, 2,2,4,4-tetramethyl-1,3-cyclobutanediol, 4,4'-thiodiphenol, bisphenol A, 4,4'-methylenediphenol, 4,4'-(2-norbornylidene)diphenol, 4,4'-dihydroxybiphenol, o-, m-, and p-dihydroxybenzene, 4,4'-isopropylidenephenol, 4,4'-isopropylidene bindiol, cyclopentane-1,2-diol, cyclohexane-1,2-diol, cyclohexane-1,4-diol, bisphenol A, or the like can be used.

When the whole of the transparent film substrate 10 is a film containing a polyester-based resin as a main component, examples of the material of the transparent film substrate include those described above as examples of the material of the functional layer 12. Among them, polyethylene terephthalate (PET), polyethylene naphthalate (PEN), polypropylene terephthalate, polybutylene terephthalate, and the like are preferred from the viewpoint of transparency and mechanical strength. The transparent film substrate 10 may include the functional layer 12, which contains a polyester-based resin as a main component, on the transparent film base 11 containing a polyester-based resin as a main component.

The thickness of the transparent film substrate 10 is not particularly limited, but is preferably 10 to 400 μm, more preferably 20 to 200 μm, further preferably 25 to 150 μm for maintaining satisfactory transparency, mechanical strength, and handling characteristics. When the thickness of the transparent film substrate 10 falls within the above-mentioned ranges, the first metal layer 210 can be formed on the transparent film substrate 10 with high productivity by a roll-to-roll method using a roll-to-roll sputtering deposition apparatus.

Preferably, the metal layer-formed surface of the transparent film substrate 10 has a surface free energy of 40 to 65 mN/m for improving adhesion with the metal layer 200. The ten-point average roughness (Rz) of the metal layer-formed surface of the transparent film substrate 10 is preferably less than 200 nm. The ten-point average roughness is measured in accordance with JIS B 0601 (1994) by dynamic force mode (DFM) measurement with a scanning probe microscope. It is to be noted that the measurement reference length is 5 μm regardless of the value of ten-point average roughness. The ten-point average roughness (Rz) of the metal layer-formed surface of the transparent film substrate 10 is preferably 180 nm or less, more preferably 150 nm or less, further preferably 120 nm or less, still more preferably 100 nm or less, especially preferably 80 nm or less, most preferably 60 nm or less, ideally 40 nm or less.

(Metal Layer)

On the transparent film substrate 10, the metal layer 200 including the first metal layer 210 and a second metal layer 220 is formed. The first metal layer and the second metal layer each contain copper as a main component. The phrase "contain copper as a main component" means that copper constitutes 90% by weight or more, preferably 95% by weight or more, further preferably 99% by weight or more of the metals that form each layer. The first metal layer and the second metal layer may be each composed of an alloy which contains other metals as long as conductivity, etching processability, and so on are not deteriorated.

Preferably, the first metal layer and the second metal layer have mutually different crystal properties. The phrase "different crystal properties" means that there is a difference in at least one of the crystal fraction, the crystal structure, the crystallite size, and the crystal lattice spacing. Particularly, in the present invention, the size of a crystallite having the (111) orientation in the second metal layer is preferably larger than that in the first metal layer. The lattice spacing of the (111) plane in the second metal layer is preferably larger than that in the first metal layer (in other words, the diffraction peak angle of the (111) plane in the second metal layer is preferably smaller than that in the first metal layer).

The thickness d of the metal layer 200 is preferably 150 nm to 1000 nm, more preferably 200 nm to 800 nm, further preferably 220 to 600 nm, especially preferably 250 to 500 nm. When the thickness of the metal layer is 150 nm or more, the conductivity required for a transparent conductive film is secured after the metal layer is patterned into a thin wire. When the thickness of the metal layer is 1000 nm or less, side etching at the time of patterning the metal layer into a thin wire is suppressed, so that patterning with a line width of 5 μm or less is possible.

The resistivity of the metal layer 200 is preferably $4.5 \times 10^{-6}$ Ωcm or less, more preferably $4.0 \times 10^{-6}$ Ωcm or less, further preferably $3.5 \times 10^{-6}$ Ωcm or less, still more preferably $3.0 \times 10^{-6}$ Ωcm or less, especially preferably $2.8 \times 10^{-6}$ Ωcm or less, ideally $2.6 \times 10^{-6}$ Ωcm or less. When the resistivity of the metal layer falls within the above-mentioned range, the conductive pattern can have the conductivity required for exhibiting a function such as position detection even when the thickness of the metal layer falls within the above-mentioned range and the line width L of the thin wire is 5 μm or less.

(First Metal Layer)

The first metal layer 210 serves to improve adhesion between the transparent film substrate 10 and the metal layer 200, and serves as a seed layer in formation of the second metal layer 220 by electroplating. For imparting these functions, the first metal layer 210 is preferably a uniform and dense film. For this reason, it is preferred that the first metal layer 210 is formed by a dry coating method suitable for formation of a thin film, such as a sputtering method or a vapor deposition method. Particularly, a sputtering method is especially preferred because a uniform thin film in a nanometer order can be formed, and a film can be continuously formed by a roll-to-roll method.

When the first metal layer 210 is formed by a sputtering method, for example, a DC, RF, or MF power source can be used. Particularly, a DC power source and an MF power source are preferred from the viewpoint of productivity. In deposition, it is preferred that after a transparent film substrate is set in an apparatus, evacuation is performed until the pressure in a deposition chamber reaches $5 \times 10^{-3}$ Pa or less. After the inside of the deposition chamber is evacuated, a film is formed while a carrier gas is introduced.

The carrier gas is preferably an inert gas such as Ar. The introduction amount of Ar is preferably 20 sccm to 1000 sccm, more preferably 100 to 500 sccm. For improving adhesion between the transparent film substrate 10 and the metal layer (metal thin wire) 20, it is preferred that nitrogen is not introduced in formation of the first metal layer by sputtering. The nitrogen partial pressure in the deposition atmosphere (background) is preferably low. The ratio ($P_{28}/P_{Ar}$) of the partial pressure of a gas with a molecular weight of 28 ($P_{28}$) to the partial pressure of argon ($P_{Ar}$) during the deposition is preferably $5 \times 10^{-3}$ or less, more preferably $1 \times 10^{-3}$ or less, further preferably $5 \times 10^{-4}$ or less. Most of the gases with a mass number of 28 are derived from nitrogen, and the partial pressure ratio thereof can be monitored using an online quadrupole mass spectrometer (Q-mass).

The pressure for formation of the first metal layer by sputtering is preferably $1 \times 10^{-2}$ to 1.0 Pa, more preferably $5 \times 10^{-2}$ to 0.8 Pa. The power density during deposition is preferably 0.3 to 10.0 W/cm$^2$, more preferably 0.8 to 5.0 W/cm$^2$.

As a method of sputtering, magnetron sputtering is preferred. For ensuring that the resistivity of the first metal layer is reduced to fall within the above-mentioned range, and from the viewpoint of film formability, the magnetic field of an erosion section of a sputtering target is preferably 500 to 2000 G, more preferably 800 to 1500 G. When the magnetic field is excessively small, the resistivity may not be sufficiently reduced because plasma during sputtering cannot be sufficiently confined. On the other hand, when the magnetic field is excessively large, the erosion section of a target is hollowed deep at an acute angle, and thus the exchange frequency of the target increases, so that productivity may be reduced.

When the first metal layer is formed by sputtering under the above-mentioned conditions, the resistivity of the first metal layer tends to decrease to about 0.7 to 0.9 times its value immediately after formation of the first metal layer, when the substrate after deposition is left standing at normal temperature. Therefore, in the present invention, a low-resistance metal layer can be formed by adjusting conditions for formation of the first metal layer.

The thickness $d_1$ of the first metal layer 210 is preferably 10 to 200 nm, more preferably 30 to 170 nm, further preferably 50 to 150 nm. When the thickness of the first metal layer 210 is less than 10 nm, the function as an underlying layer at the time of forming the second metal layer 220 thereon is not sufficient, and thus the second metal layer may be a nonuniform film. On the other hand, when the thickness of the first metal layer exceeds 200 nm, an improvement in the effect as an underlying layer cannot be much expected. A deposition rate of a wet plating method is larger as compared to that of a sputtering method, and therefore for improving productivity of the metal layer, it is preferred that the thickness $d_1$ of the first metal layer is relatively small, and the thickness $d_2$ of the second metal layer is relatively large. Therefore, for improving productivity of the metal layer 200 (reducing the total time for formation of the first metal layer and the second metal layer), the thickness of the first metal layer is preferably 200 nm or less.

The first metal layer 210 can also serve to improve adhesion between the transparent film substrate 10 and the metal layer 200. Therefore, the first metal layer 210 is formed directly on the transparent film substrate 10 so as to be in contact with a surface of the transparent film substrate 10, which contains a polyester-based resin as a main component. The reason why adhesion is improved when a film is formed by sputtering on the surface containing a polyester-based resin as a main component is not evident, but it is assumed that oxygen atoms in polyester serve as a factor of improving affinity with copper.

In studies by the present inventors, a region near an interface of a copper layer on the substrate side was analyzed by X-ray photoelectron spectroscopy when copper was deposited on a polyester-based resin by a sputtering method, and the result showed that copper oxide ($Cu_2O$ or $CuO$) was generated on a region of about 4 to 7 nm from the interface. From this result, it is assumed that oxygen atoms in polyester form a chemical bond or an electrical interaction with copper deposited on the substrate, so that the adhesive strength is improved. The copper layer formed on the polyester-based resin by a sputtering method tends to have a small residual stress as determined from X-ray diffraction, and thus relaxation of stress may also contribute to improvement of adhesion.

The size of the crystallite in the first metal layer as determined by X-ray crystal diffraction in out-of-plane measurement is preferably 30 nm or less, more preferably 28 nm or less. The diffraction angle $2\theta$ of the (111) plane as measured using a $CuK\alpha$ ray as an X-ray source is preferably 43.430° or less, more preferably 43.420° or less, further preferably 43.410° or less. The lower limit of the diffraction angle $2\theta$ of the (111) plane is not particularly limited, but is generally 43.250° or more, preferably 43.300° or more, more preferably 43.350° or more.

When the diffraction angle of the (111) plane of the first metal layer falls within the above-mentioned range, adhesion between the transparent film substrate and the metal layer tends to be improved. The reason why adhesion is improved when the diffraction angle of the (111) plane is 43.430° or less is not evident, but it is assumed that delamination at the interface between the transparent film substrate 10 and the first metal layer 210 is suppressed because the difference between a lattice spacing of the (111) plane of the first metal layer and a lattice constant of an ideal copper single crystal is small, i.e., stress strain in the film is small. For ensuring that the diffraction angle of the (111) plane falls within the above-mentioned range, it is preferred that the first metal layer is formed on a surface of the base, which contains a polyester-based resin as a main component, by a sputtering method as described above.

(Second Metal Layer)

The second metal layer 220 is formed on the first metal layer 210. The thickness $d_2$ of the second metal layer 220 can be appropriately set so that the thickness of the first metal layer 210 and the total thickness of the metal layer 200 each fall within the above-mentioned range. The thickness of the second metal layer 220 is preferably 50 to 990 nm, more preferably 100 to 900 nm, further preferably 200 to 800 nm.

It is preferred that the second metal layer 220 is formed by a wet plating method. By the wet plating method, second metal layers can be simultaneously formed on both surfaces of the transparent film substrate 10. For example, when metal layers are to be formed on both surfaces of the transparent film substrate, second metal layers can be simultaneously deposited on both the surfaces by forming the first metal layer on each of one surface and the other surface of the transparent film substrate 10 by a sputtering method, and then performing wet plating. Among wet plating methods, an electroplating method is especially preferred for increasing the deposition rate.

In the present invention, the thickness $d_1$ of the first metal layer 210 is preferably smaller than the thickness $d_2$ of the second metal layer 220. The ratio of the thickness $d_1$ to the thickness $d_2$ is preferably 0.5 or less, further preferably 0.35 or less. That is, in the present invention, it is preferred that the first metal layer 210 is formed on the transparent film substrate 10 by a sputtering method in order to impart the conductivity and adhesion that are required for depositing copper by electroplating, and then forming most of the thickness of the metal layer 200 by an electroplating method, which is capable of depositing copper at a higher rate as compared to the sputtering method. When such a configuration is employed, a conductive film excellent in adhesion between the transparent film substrate 10 and the metal layer 200 is obtained with high productivity. On the other hand, for obtaining conductivity required for depositing copper by electroplating, the ratio of the thickness $d_1$ of the first metal layer 210 to the thickness $d_2$ of the second metal layer 220 is preferably 0.1 or more, more preferably 0.15 or more, further preferably 0.2 or more.

Further, when the first metal layer is formed on the transparent film substrate 10 without interposition of an underlying metal layer therebetween, the first metal layer is formed on a surface of the transparent film substrate 10, which contains a polyester-based resin as a main component, and the second metal layer is formed thereon by an electroplating method to produce the metal layer 200 excellent in formability of a thin wire pattern by etching. The reason for this is not necessarily evident, but it is assumed that this is related to the tendency of the lattice spacing of the (111) plane of copper to be large in the second metal layer in the above-mentioned configuration. In other words, it is assumed that when the first metal layer is formed on a specific layer of a polyester-based resin or the like, the lattice spacing of the (111) plane of the first metal layer is increased under the influence of the underlay for deposition, and thus the lattice spacing of the (111) plane in the second metal layer formed with the first metal layer as an underlying layer is also increased. In addition, the properties of the first metal layer may influence on the density, etc., of the second metal layer.

In the present invention, the diffraction angle 2θ of the (111) plane in the second metal layer as measured by using a CuKα ray as an X-ray source is preferably less than 43.400°. When the diffraction angle of the (111) plane is less than 43.400°, etching characteristics tend to be improved. When the current density in formation of the second metal layer by electroplating is reduced, the diffraction angle of the (111) plane tends to decrease. However, it is difficult to reduce the diffraction angle of the (111) plane to less than 43.400° only by adjusting the current density in plating.

When the current density in plating is reduced, productivity tends to be reduced because the deposition rate of the second metal layer decreases. On the other hand, in the present invention, by employing a prescribed stack configuration, the diffraction angle of the (111) plane can be reduced (i.e., the lattice spacing of the (111) plane can be increased) while the current density is maintained. The diffraction angle 2θ of the (111) plane of the second metal layer is preferably 43.390° or less, more preferably 43.380° or less, further preferably 43.370° or less.

Generally, when metal layers obtained by electroplating are observed in bulk, the same metal layers tend to be deposited regardless of the type of the underlying layer as long as there is no difference in composition of the plating solution and current density. On the other hand, in the present invention, the second metal layer 220 may be more strongly influenced by the composition and crystallinity of the first metal layer 210 as an underlying layer because the second metal layer has a small thickness of several hundreds of nanometers.

The ten-point average roughness (Rz) of the surface of the second metal layer is preferably less than 200 nm. The ten-point average roughness (Rz) of the surface of the second metal layer is preferably 180 nm or less, more preferably 150 nm or less, further preferably 120 nm or less, still more preferably 100 nm or less, especially preferably 80 nm or less, most preferably 60 nm or less, ideally 40 nm or less. When the Rz of the surface of the second metal layer is small, side etching tends to be suppressed, leading to suppression of an increase in resistance and line breakage.

<Formation of Resist Pattern>

The resist pattern 33 is formed on the second metal layer 220. Another layer may be formed on the second metal layer 220 before the resist layer 31 is applied. For example, a protecting layer (not illustrated) such as a metal layer or a polymer layer may be provided for the purpose of preventing oxidation and degradation of the second metal layer. For patterning the protecting layer similarly to the metal layer, it is preferred that the protecting layer is composed of a metallic material which is removable by an etchant used for etching the metal layer 200.

The method for forming a resist pattern is not particularly limited. Generally, as shown in FIG. 3 at (B), a resist material is applied to form the resist layer 31, and patterning is then performed through exposure and development to form the resist pattern 33 shown in FIG. 3 at (C). The shape and line width of the resist pattern 33 are appropriately set so that the metal layer is patterned into a desired pattern shape. The metal layer 200 at a region where the resist pattern is formed thereon ultimately frames the thin wire 20, and therefore the line width of the resist pattern 33 is preferably 5 μm or less, more preferably 3 μm or less.

<Etching>

The metal layer 200 on a resist pattern-non-formed region is removed by wet etching to pattern the layer into the thin wires 20 shown in FIG. 3 at (D). In the patterning, it is preferred to perform anisotropic etching in which etching progresses preferentially in the thickness direction of the metal layer 200. When etching in the in-plane direction of the metal layer (side etching) progresses, the line width of the thin wire tends to decrease, leading to an increase in resistance and line breakage. In the present invention, the first metal layer 210 and the second metal layer 220 are sequentially formed on the prescribed transparent film substrate 10, and thus the second metal layer 220 that constitutes most of the thickness of the metal layer 200 has prescribed crystal properties. It is assumed that accordingly, etching can be made to progress selectively in the thickness direction of the metal layer, so that side etching is suppressed.

<Removal of Resist Pattern>

After the metal layer is patterned by etching, the resist pattern 33 is removed to give a transparent conductive film including on the transparent film substrate 10 the thin metal wires 20 composed of a first metal layer 211 and a second metal layer 221 as shown in FIG. 3 at (E). The method for removing a resist pattern is not particularly limited, but, generally, the resist pattern is removed by peeling.

[Second Embodiment: Semi-Additive Method]

Figure 4:
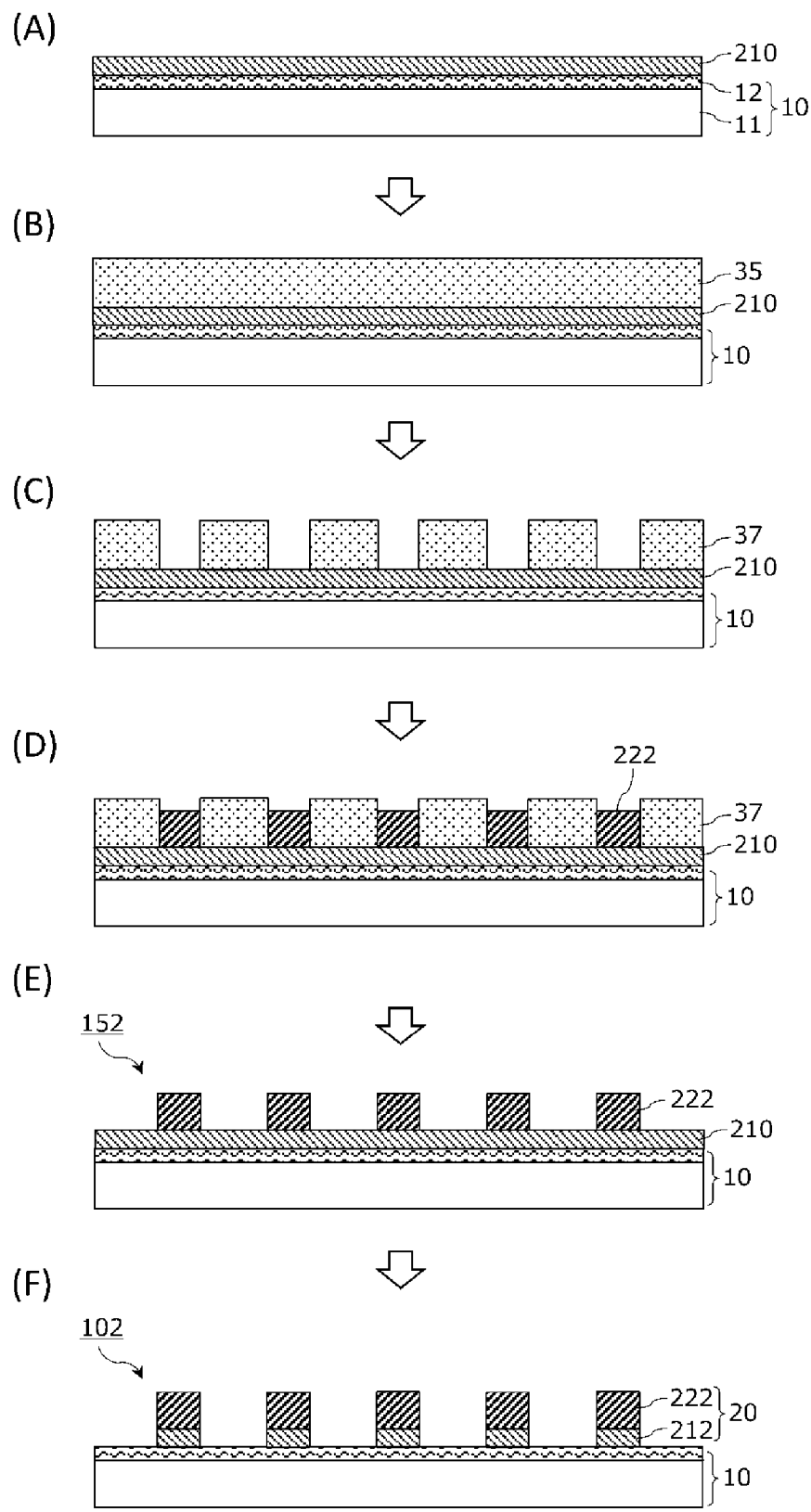
FIG. 4 is a conceptual view showing one embodiment of a process for producing a transparent conductive film.

FIG. 4 is a schematic conceptual view showing another example of a process for producing a transparent conductive film 102. In this embodiment, first, a first metal layer 210 is formed on a transparent film substrate 10 as shown in FIG. 4 at (A). Thereafter, on the first metal layer 210, a resist layer 35 is formed (FIG. 4 at (B)), and a resist pattern 37 is formed (FIG. 4 at (C)). Thereafter, a second metal layer 222 is formed on a resist pattern-non-formed section (FIG. 4 at (D)), and the resist pattern is removed to give a conductive film substrate 152 with the second metal layer 222 patterned into a thin wire (FIG. 4 at (E)). Finally, the exposed section of the first metal layer 210 is patterned similarly to the second metal layer 222 by etching to give the transparent conductive film 102 including on a first metal layer 212 thin metal wire 20 having the second metal layer 222 as shown in FIG. 4 at (F). The series of steps are substantially identical to the steps of a semi-additive method in a technique for producing a printed wiring board.

<Formation of First Metal Layer>

In this embodiment, the material of the transparent film substrate 10, the method for forming the first metal layer 210 on the transparent film substrate, and so on are the same as in the first embodiment. That is, in this embodiment as well as the aforementioned embodiment, it is preferred that the first metal layer 210 is formed on a surface of the transparent film substrate 10, which contains a polyester-based resin as a main component, by a dry coating method such as a sputtering method.

<Formation of Resist Pattern>

The resist pattern 37 is formed on the first metal layer 210. The method for forming a resist pattern is not particularly limited. Generally, as shown in FIG. 4 at (B), a resist material is applied to form the resist layer 35, and patterning is then performed through exposure and development to form the resist pattern 37 shown in FIG. 4 at (C). The shape and width of the resist pattern 37 are appropriately set so that the metal layer is patterned into a desired pattern shape. As shown in FIG. 4 at (D), the second metal layer 222 is formed on an opening region where the resist pattern is not formed, and the second metal layer 222 ultimately frames the thin metal wire 20. Therefore, the opening width of the resist pattern 37 is preferably 5 μm or less, more preferably 3 μm or less. For ensuring that the thin wire has a uniform width and has linearity, it is preferred that the thickness of the resist layer 35 is adjusted to be larger than the thickness of the second metal layer 222.

<Formation of Second Metal Layer>

In this embodiment, it is preferred that the second metal layer 222 is formed by a wet plating method, and for increasing the deposition rate, an electroplating method is especially preferred. This embodiment is different from the first embodiment in that as shown in FIG. 4 at (D), the second metal layer 222 is formed only on an opening region where the resist pattern 37 is not formed. On the other hand, the range of the thickness of each of the first metal layer and the second metal layer, and the like are the same as in the first embodiment. In this embodiment, as well as in the first embodiment, a metal layer 20 excellent in adhesion with the transparent film substrate 10 is obtained because a second metal layer is formed on a prescribed first metal layer by a wet plating method.

<Removal of Resist Pattern>

After the second metal layer 222 is formed, the resist pattern 37 is removed as shown in FIG. 4 at (E).

<Etching of First Metal Layer (Seed Layer)>

After the resist pattern is removed, the exposed section of the first metal layer 210 is etched to be patterned similarly to the second metal layer 222 as shown in FIG. 4 at (F). In this embodiment, the second metal layer 222 that constitutes most of the thickness of the metal layer is patterned beforehand, and therefore only the first metal layer 210 has to be patterned by etching. Accordingly, the etching depth and the etching time are considerably reduced, so that side etching can be further suppressed as compared to the first embodiment.

[Other Aspects: Underlying Metal Layer is Provided]

An aspect in which a first metal layer is formed on a polyester resin (layer), and a second metal layer is formed thereon has been described above, but the present invention is not limited to such an aspect. As described above, the metal layer 200 tends to be excellent in formability of a thin wire pattern by etching when the lattice spacing of the (111) plane of the second metal layer is large, i.e., the diffraction angle 2θ of the (111) plane of the second metal layer is less than 43.400° as measured using a CuKα ray as an X-ray source.

When the lattice spacing of the (111) plane of the first metal layer is large, the lattice spacing of the (111) plane of the second metal layer formed thereon tends to be large as shown later in Examples. The lattice spacing of the (111) plane tends to be large also when a layer containing copper as a main component is formed as a first metal layer on a prescribed underlying metal layer as shown in, for example, FIG. 2B.

In the aspect shown in FIG. 2B, an underlying metal layer 23 is formed on the transparent film substrate 10. As the underlying metal layer 23, a Ni layer containing Ni as a main component is preferably used. The content of Ni in the Ni layer is preferably 60% by weight or more.

This aspect is the same as the aspect shown in FIG. 2A except that the underlying metal layer 23 is formed between the transparent film substrate 10 and the first metal layer 21. The transparent film substrate 10 may include a functional layer (not illustrated) on a surface on which the underlying metal layer 23 is formed. Ni has a lower metallic glossiness as compared to Cu. Therefore, when the thin metal wire 26 includes a Ni layer as the underlying layer 23 between the first metal layer 21 containing copper as a main component and the transparent film substrate 10, a transparent conductive film which has a low metallic glossiness when viewed from the substrate 10 side, and is thus excellent in visibility is obtained. When the first metal layer 21 is formed on the underlying metal layer 23, the material of a surface of the transparent film substrate 10, which is in contact with the underlying metal layer 23, is not particularly limited.

[Third Embodiment: Subtractive Method]

Figure 5:
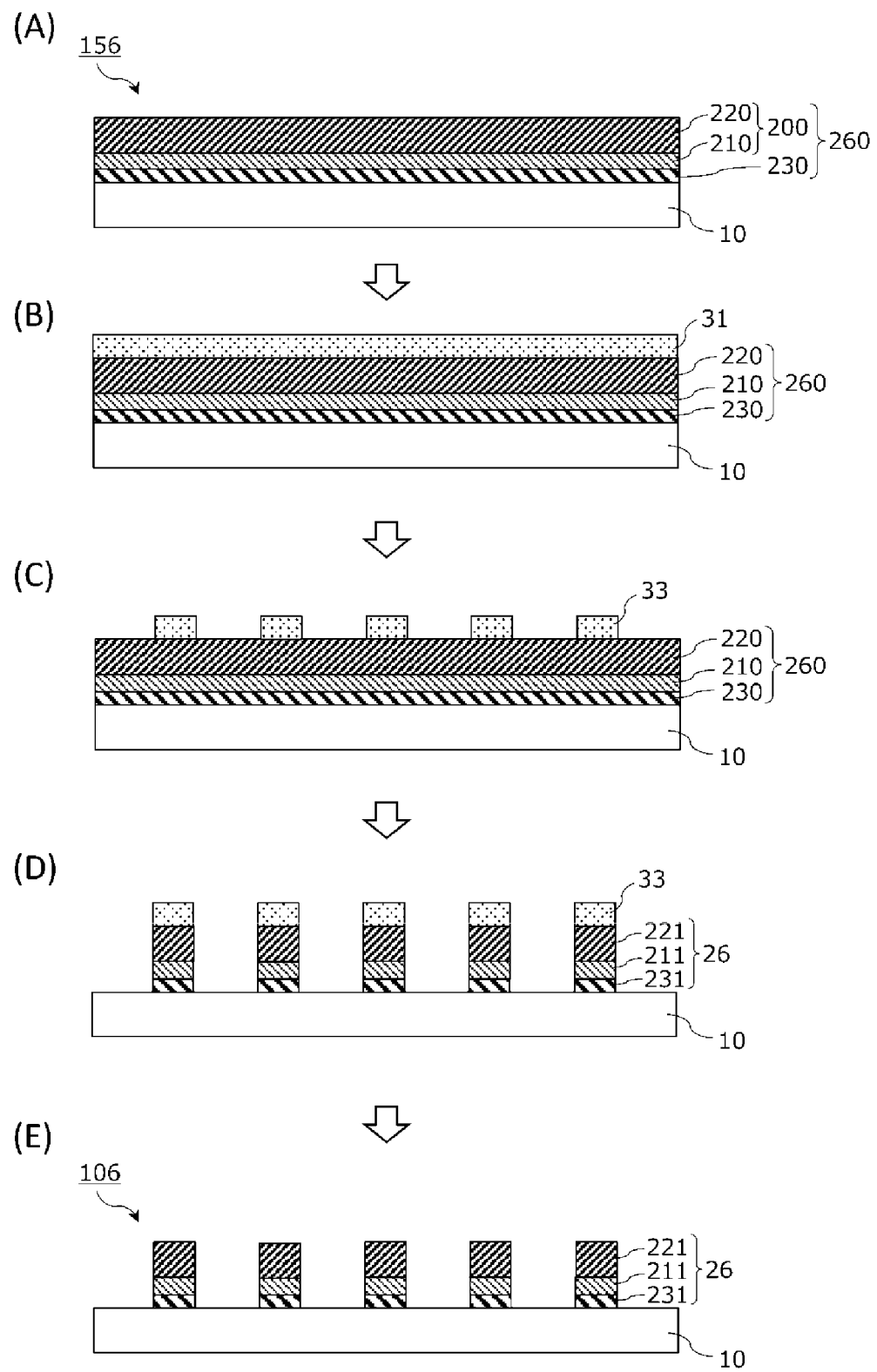
FIG. 5 is a conceptual view showing one embodiment of a process for producing a transparent conductive film.

FIG. 5 is a schematic conceptual view showing a process for producing a transparent conductive film 106 including an underlying metal layer 230. In the aspect shown in FIG. 5, first, an underlying metal layer 230 and a metal layer 200 are formed on a transparent film substrate 10 to give a conductive film substrate 156 (FIG. 5 at (A)). Thereafter, on the metal layer 200, a resist layer 31 is formed (FIG. 5 at (B)), and a resist pattern 33 is formed (FIG. 5 at (C)). Thereafter, the metal layer 200 and resist pattern-non-formed section of the underlying metal layer 230 are removed by wet etching to form a thin metal wire 26 (FIG. 5 at (D)). Finally, the resist pattern is removed to give the transparent conductive film 106 (FIG. 5 at (E)).

In the aspect shown in FIG. 5, a transparent conductive film is formed in a process similar to that in the aspect shown in FIG. 3 (subtractive method). In this embodiment, the method for forming the first metal layer and the second metal layer, the thickness of each of these layers, and so on are the same as in the embodiment shown in FIG. 3. Hereinafter, descriptions overlapping those in the aspect shown in FIG. 3 are omitted.

(Underlying Metal Layer)

The underlying metal layer 230 containing Ni as a main component is formed on a transparent film substrate 10. The underlying metal layer 230 has electric conductivity, and functions as an adhesion assisting layer that strongly adheres a metal layer 200, which is formed thereon, to transparent film substrate 10. Preferably, a dense film is formed on the transparent film substrate 10 for obtaining such an adhesion improving effect. For this reason, it is preferred to employ a dry coating method such as a sputtering method or a vapor deposition method as a method for forming an underlying metal layer. Particularly, a sputtering method is preferred because a uniform thin film is formed, a thin film in a nanometer order is easily formed, and mass production by a roll-to-roll method is feasible.

When the underlying metal layer 230 is formed by a sputtering method, a power source such as a DC, RF, or MF power source can be used. As a condition for formation of the underlying metal layer 230, the degree of vacuum is preferably $1\times10^{-2}$ to 1 Pa, more preferably $5\times10^{-2}$ to 0.8 Pa. The power density is preferably 0.35 to 7.0 W/cm$^2$, more preferably 0.9 to 4.6 W/cm$^2$. An Ar gas is preferred as a sputtering gas (inert gas). The underlying metal layer 230 may be a layer composed of Ni, or may be a Ni alloy layer. For example, a Ni—Cu alloy etc., may be deposited as a material of the underlying metal layer for the purpose of, for example, improving adhesion with the first metal layer (Cu) formed on the underlying metal layer 230.

The thickness of the underlying metal layer 230 is preferably 20 to 50 nm. When the thickness of the underlying metal layer is less than 20 nm, function as an adhesion assisting layer may be insufficient, or the etching characteristics of a second metal layer formed on the first metal layer may be deteriorated because the crystalline lattice spacing thereof is not sufficiently increased. When the thickness of the underlying metal layer is 20 nm or more, the adhesion of a metal layer and the etching characteristics of a second metal layer tend to be improved. When the thickness of the underlying metal layer is 20 nm or more, metallic glossiness when the transparent conductive film is viewed from the film substrate 10 side tends to be suppressed, leading to improvement of visibility. On the other hand, even when the thickness of the underlying metal layer exceeds 50 nm, the above-mentioned effect is not significantly improved, and rather there tends to be a disadvantage from an economic viewpoint. In the later-described aspect (semi-additive method) shown in FIG. 6, defects such as line breakage may occur due to under-etching etc. during removal of a seed layer (FIG. 6 at (F)) when the thickness of the underlying metal layer 230 increases.

(Metal Layer)

The metal layer 200 including a first metal layer 210 and a second metal layer 220 is formed on the underlying metal layer 230. The first metal layer 210 is formed on the underlying metal layer 230 so as to be in contact therewith. As a method for forming the first metal layer and the second metal layer, the same method as that described above for the aspect in FIG. 3 is employed.

In this embodiment, it is preferred that the underlying metal layer 230 and the first metal layer 210 are successively formed. The phrase "successively formed" means that after the underlying metal layer is formed, the first metal layer is formed without exposing the surface of the underlying metal layer to the air. When the first metal layer is successively formed on the underlying metal layer, passivation due to oxidation of the Ni surface tends to be suppressed, leading to improvement of adhesion between the underlying metal layer and the first metal layer.

When the first metal layer containing copper as a main component is formed on the Ni layer as an underlying metal layer, the diffraction angle 2θ of the (111) plane tends to decrease (the lattice spacing tends to increase) as in the case where the first metal layer is formed on a polyester-based resin layer, and the diffraction angle 2θ of the (111) plane of the second metal layer formed on the first metal layer by a plating method tends to increase. Therefore, etching characteristics during patterning tend to also be improved in this aspect.

In this embodiment, the total thickness of the underlying metal layer 230, the first metal layer 210 and the second metal layer 220 is preferably 150 to 1000 nm, more preferably 200 to 800 nm, further preferably 220 to 600 nm, especially preferably 250 to 500 nm.

<Patterning>

In the aspect in which the metal layer 200 is formed on the underlying metal layer 230, the metal layer 200 and the underlying metal layer 230 are patterned, similarly to the case of FIG. 3, to give the transparent conductive film 106 by performing the following steps: forming a resist layer 31 on the second metal layer 220 of a conductive film substrate 156 (FIG. 5 at (B)); forming a resist pattern 33 (FIG. 5 at (C)); etching (FIG. 5 at (D)); and removing the resist pattern (FIG. 5 at (E)). In the aspect in which the underlying metal layer 230 is provided, patterning is performed with the underlying metal layer 230 removed together with the first metal layer 210 and the second metal layer 220 during etching as shown in FIG. 5 at (D).

[Fourth Embodiment: Semi-Additive Method]

Figure 6:
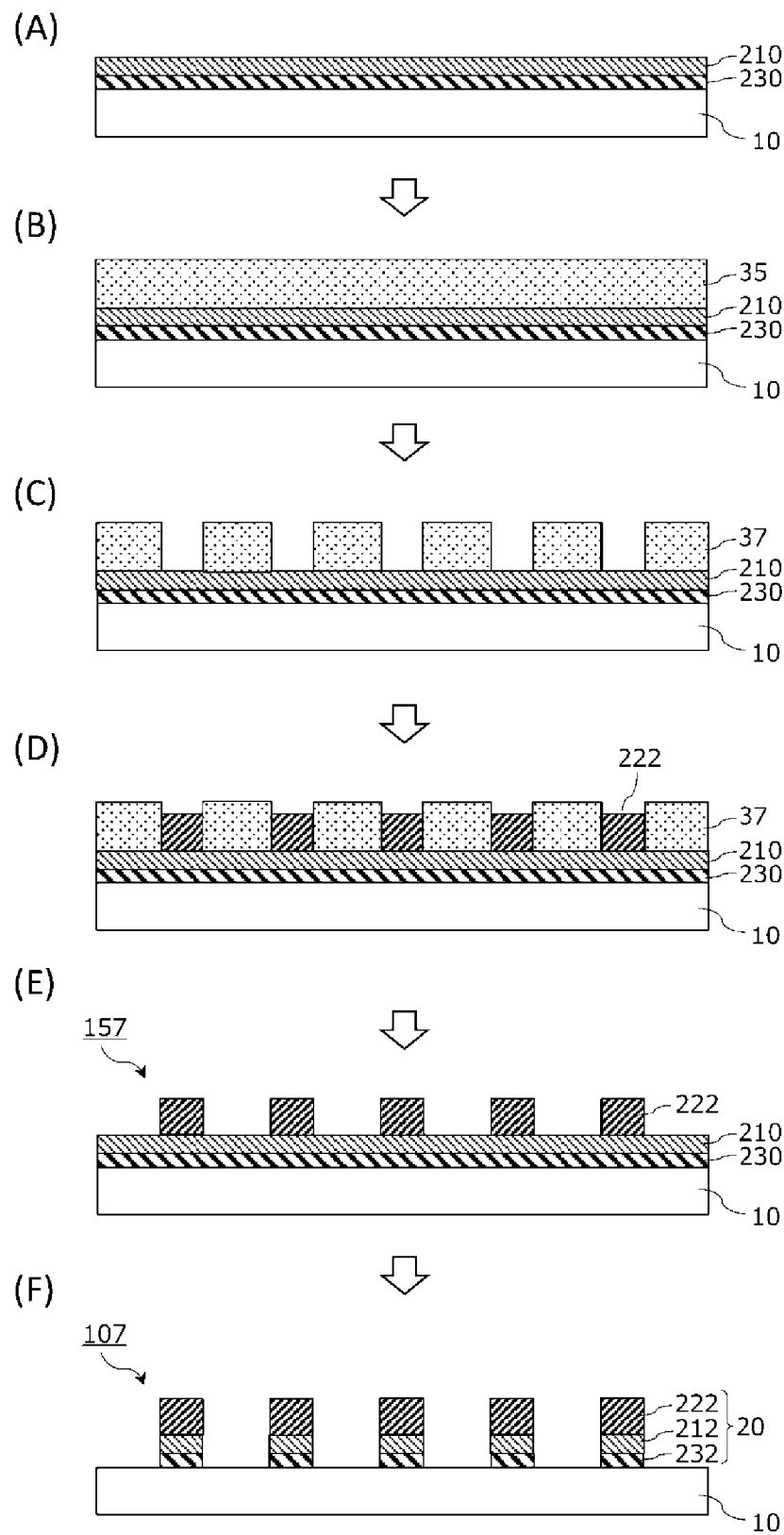
FIG. 6 is a conceptual view showing one embodiment of a process for producing a transparent conductive film.

FIG. 6 is a schematic conceptual view showing a process for producing a transparent conductive film 107 including an underlying metal layer 232 by a semi-additive method. The aspect shown in FIG. 6 is substantially the same as the aspect shown in FIG. 4, but it is different from the aspect shown in FIG. 4 in that the underlying metal layer 230 is formed as an underlay for the first metal layer 210 (FIG. 6 at (A)), and in removal of a seed layer (FIG. 6 at (F)), the underlying metal layer 230 as well as the first metal layer 210 is patterned by etching.

In this embodiment, the method for forming each layer is the same as in the aspect in FIG. 5, the production process using a semi-additive method is the same as in the aspect in FIG. 4, and therefore detailed descriptions thereof are omitted here.

[Characteristics and Usage of Transparent Conductive Film]

As described above, according to the present invention, a transparent conductive film including a patterned thin metal wire with a line width of 5 μm or less on a transparent film substrate is obtained. In the transparent conductive film of the present invention, the total light transmittance of a conductive pattern-formed section is preferably 85% or more. When a substrate having a high transmittance is used as the transparent film substrate 10 and the theoretical opening ratio of the conductive pattern is set to 97% or more, the above-mentioned total light transmittance can be achieved. In the transparent conductive film of the present invention, the sheet resistance of the conductive pattern-formed section is preferably 50 Ω/sq or less.

The transparent conductive film of the present invention can be used as a transparent electrode for a solar cell, a light-emitting element, a display device, a touch panel, or the like. Particularly, the transparent conductive film of the present invention is preferably used as a position detecting electrode for a capacitive touch panel because the thin metal wire has a small line width of 5 μm or less and is hardly visible even at a close distance, and the resistance is low.

EXAMPLES

Hereinafter, the present invention will be described more in detail by comparison of examples with comparative examples, but the present invention is not limited to the examples below.

Reference Example 1

Transparent Film Substrate

A biaxially-stretched polyethylene terephthalate (PET) film, including on each of both surfaces thereof a functional layer (easy-adhesion layer) composed of a polyester-based resin, was used as a transparent film substrate. The total light transmittance of the transparent film substrate was 93%. The total light transmittance was measured using a turbidity meter (NDH-5000 manufactured by NIPPON DENSHOKU INDUSTRIES CO., LTD.).

(Formation of First Metal Layer)

The transparent film substrate was set in a roll-to-roll sputtering apparatus, and evacuation was then performed until the pressure reached $1 \times 10^{-3}$ Pa or less. Thereafter, the temperature of the film substrate was elevated to 70° C., and degassing was performed until the back pressure in the deposition chamber reached $5 \times 10^{-4}$ Pa. After degassing, cooling was performed until the temperature of the film substrate was decreased to 25° C. After cooling, a copper layer having a thickness of 50 nm was formed by sputtering under conditions of a deposition chamber internal pressure of 0.2 Pa, a substrate temperature of 25° C., and a power density of 4.2 W/cm² while an Ar gas was introduced into the apparatus with Cu used as a target.

Example 1-1

Formation of Second Metal Layer

The PET film with a copper layer (first metal layer), which was obtained in Reference Example 1, was set in an electroplating apparatus. A plating bath was filled with an aqueous copper sulfate solution having a concentration of 15% by weight, and the substrate with a copper layer was immersed in the plating bath. A second metal layer having a thickness of 250 nm was formed on a first metal layer by performing electroplating at a liquid temperature of 25° C. and a current density as shown in Table 1.

(Patterning of Metal Layer)

A positive photoresist (manufactured by AZ Electronic Materials; product name: AZ-6112) was applied on the second metal layer with a thickness of 2 μm by a spin coating method. Pre-baking was performed on a hot plate set at 90° C., and then exposed to an ultraviolet ray with an integrated irradiation amount of 56 mJ. Thereafter, immersion in a developer (manufactured by AZ Electronic Materials; liquid of product name: AZ 400K diluted to 25%) was performed to develop the resist. Rinsing was performed with pure water to form a resist pattern in which a plurality of straight lines each having a line width of 3 μm were arranged on a metal layer. The metal layer was etched using an etchant (manufactured by MEC Co., Ltd.; product name: MECBRITE SF-5420). Rinsing was performed with pure water, the resist was then peeled with a peeling solution (product name: AZ 400K), and the metal layer was rinsed with pure water, and then dried. In the obtained transparent conductive film with a metal layer patterned into a thin wire, the total light transmittance of the pattern-formed section was 90.0%, and the opening ratio thereof was 98.5%. Using a scanning confocal laser microscope (manufactured by Olympus Corporation), the thin wire shape after patterning was observed over the observation length of 1000 μm, and the result showed that line breakage did not occur. The line width of the thin wire (average for five measurement points) was 3.0 μm, and it was confirmed that there was almost no side etching.

Reference Example 2

As a transparent film substrate, a 50 μm-thick biaxially-stretched PET film (total light transmittance: 93%) which was not provided with a functional layer was used. In the same manner as in Reference Example 1 except that the above-mentioned change was made, a first metal layer was formed on the transparent film substrate.

Reference Example 3

A PET film similar to that used in Reference Example 1 was set in a roll-to-roll sputtering apparatus including a plurality of deposition chambers, and evacuation was then performed until the pressure reached $1 \times 10^{-3}$ Pa or less. Thereafter, the temperature of the film substrate was elevated to 70° C., and degassing was performed until the back pressure in the deposition chamber reached $5 \times 10^{-4}$ Pa. After degassing, cooling was performed until the temperature of the film substrate decreased to 25° C. After cooling, a Ni layer having a thickness of 50 nm and a copper layer having a thickness of 50 nm were sequentially formed by sputtering under the condition of a substrate temperature of 25° C. while an Ar gas was introduced into the apparatus with Ni and Cu used as targets. For the conditions for formation of the Ni layer, the deposition chamber internal pressure was 0.2 Pa, and the power density was 1.1 W/cm², and for the conditions for formation of the Cu layer, the deposition chamber internal pressure was 0.2 Pa, and the power density was 4.2 W/cm².

Comparative Reference Example 1

As a transparent film substrate, a 50 μm-thick biaxially stretched PET film (total light transmittance: 92%) including an acrylic hard coat layer on each of both surfaces was used. In the same manner as in Reference Example 1 except that the above-mentioned change was made, a first metal layer was formed on the transparent film substrate.

Comparative Reference Example 2

As a transparent film substrate, a 50 μm-thick biaxially stretched PET film including an acrylic urethane-based hard coat layer on each of both surfaces was used. In the same manner as in Reference Example 1 except that the above-mentioned change was made, a first metal layer was formed on the transparent film substrate.

Examples 1-2 and 1-3, Example 2, Example 3, Comparative Example 1, and Comparative Example 2

The transparent film base and the current density in plating during formation of the second metal layer were changed as shown in Table 1. In the same manner as in Example 1-1 except that the above-mentioned change was made, a second metal layer was formed on a first metal layer, and the metal layer was then patterned.

[Evaluation of Crystal Properties by X-Ray Diffraction]

The lattice spacing in a direction orthogonal to the substrate surface (out-of-plane measurement) was measured by X-ray diffraction by a 2θ/θ method using an X-ray diffraction measurement device ("RINT 2000" manufactured by Rigaku Corporation) equipped with a Cu.Kα ray as an X-ray source. For the measurement conditions, the divergence slit was set to 1°, the vertical divergence limitation slit was set to 10 mm, the scattering slit was set to 1°, the photoreception slit was set to 0.3 mm, the monochromatic photoreception slit was set to 0.8 mm, the X-ray intensity was set to 50 kV·50 mA, the scanning speed was set to 2.00°/minute, and the sampling interval was set to 0.02°. In the analysis of the obtained X-ray diffraction pattern, background correction was performed, an integrated intensity was calculated, and a peak was analyzed by a peak top method using software (integral analysis for windows) accompanied to the device. In the analysis, Kα1 removal and smoothing were not performed. For calculation of the crystallite size, a Scherrer method was used, the Scherrer constant was set to 0.94, and a half-width was applied. In Example 1-2, the peak intensity of the (220) plane in X-ray diffraction was low, so that the half-width could not be accurately identified. Therefore, the value of 42.3 nm described as a crystallite size in Table 1 is provisional, and is not an accurate value.

Table 1 shows production conditions (stack configurations) and evaluation results in the above-described Examples, Comparative Examples, Reference Examples, and Comparative Reference Examples.

Etching characteristics in Table 1 were evaluated based on the following criteria.

Good: the line width (five-point average) of the thin metal wire after patterning is 2 μm or more (side etching amount is 1 μm or less), and there is no line breakage over the observation length of 1000 μm.

Poor: there are one or more line breakages over the length of 1000 μm.

TABLE 1

| | Transparent film substrate | | Underlying metal layer | First metal layer | Second metal layer | | Crystallite size (nm) | | | Diffraction peak angle 2θ (°) | | | Etching charac- teristics |
|---|---|---|---|---|---|---|---|---|---|---|---|---|---|
| | Base | Functional layer | Thickness (nm) | Thickness (nm) | Thickness (nm) | Current density (A/dm$^2$) | (111) | (200) | (220) | (111) | (200) | (220) | |
| Reference Example 1 | PET | Polyester-based | — | 50 | — | | 26.0 | — | — | 43.408 | — | — | |
| Example 1-1 | | | — | 50 | 250 | 0.2 | 35.4 | 23.9 | 25.9 | 43.361 | 50.495 | 74.177 | Good |
| Example 1-2 | | | — | 50 | 250 | 1 | 34.1 | 24.5 | (42.3) | 43.383 | 50.554 | 74.228 | Good |
| Example 1-3 | | | — | 50 | 250 | 2 | 34.3 | 27.2 | 21.7 | 43.370 | 50.552 | 74.116 | Good |
| Reference Example 2 | PET | — | — | 50 | — | | 22.6 | — | — | 43.404 | — | — | |
| Example 2 | | | — | 50 | 250 | 0.2 | 32.7 | 21.9 | 19.0 | 43.364 | 50.510 | 74.242 | Good |
| Reference Example 3 | PET | Polyester-based | 50 | 50 | — | | 18.8 | — | — | 43.421 | — | — | |
| Example 3 | | | 50 | 50 | 250 | 0.2 | 33.9 | 26.7 | 20.0 | 43.390 | 50.538 | 74.266 | Good |
| Comparative Reference Example 1 | PET | Acrylic | — | 50 | — | | 25.4 | — | — | 43.460 | — | — | |
| Comparative Example 1 | | | — | 50 | 250 | 0.2 | 35.0 | 21.3 | 17.5 | 43.404 | 50.560 | 74.334 | Poor |
| Comparative Reference Example 2 | PET | Acrylic urethane-based | — | 50 | — | | 27.1 | — | — | 43.441 | — | — | |
| Comparative Example 2 | | | — | 50 | 250 | 0.2 | 37.2 | 26.8 | 22.0 | 43.405 | 50.538 | 74.242 | Poor |

As shown in Table 1, the diffraction peak angle of the (111) plane of the first metal layer is smaller in Reference Example 1 and Reference Example 2, as compared to Comparative Reference Example 1 and Comparative Reference Example 2. It is apparent that, accordingly, in Examples 1-1 to 1-3 and Example 2, the diffraction peak angle of the (111) plane of the second metal layer is smaller as compared to Comparative Examples 1 and 2, and thus good etching characteristics are obtained. In Examples 1-1 to 1-3, the diffraction peak angle of the (111) plane of the second metal layer tends to decrease (the lattice spacing tends to increase) when the current density during formation of the second metal layer is reduced, but the difference among Examples 1-1 to 1-3 is insignificant when compared to a difference between the examples and comparative examples.

From the above results, it is apparent that according to the present invention, a metal layer is formed on a surface of a transparent film substrate, which contains a polyester-based resin as a main component, and thus a metal layer which is excellent in etching processability and in which side etching is suppressed is obtained.

In Reference Example 3 where the first metal layer is formed on the Ni layer (underlying metal layer), the diffraction peak angle of the (111) plane of the first metal layer is smaller as compared to Comparative Reference Example 1 and Comparative Reference Example 2. It is apparent that, accordingly, in Example 3, the diffraction peak angle of the (111) plane of the second metal layer is small, and thus good etching characteristics are obtained. From this result, it is apparent that a metal layer which is excellent in etching processability and in which side etching is suppressed is obtained also when a metal layer is formed on an underlying metal layer.

REFERENCE CHARACTER LIST 10 transparent film substrate
11 transparent film base
12 functional layer
20 thin metal wire (metal layer)
26 thin metal wire (metal layer and underlying metal layer)
200 metal layer
21, 210, 212 first metal layer
22, 220, 222 second metal layer
23, 230, 232 underlying metal layer
33, 37 resist pattern
100, 101, 102, 105, 106, 107 transparent conductive film
151, 152, 156, 157 conductive film substrate
251 to 253 conductive pattern

The invention claimed is:

1. A transparent conductive film comprising: a transparent film substrate; and a transparent electrode layer composed of a patterned thin metal wire on at least one surface of the transparent film substrate, wherein
the thin metal wire has a line width of 5 μm or less,
the thin metal wire includes a first metal layer and a second metal layer in this order from a transparent film substrate side, the second metal layer being in contact with the first metal layer,
the first metal layer and the second metal layer each contain copper in an amount of 90% by weight or more,
a total thickness of the first metal layer and the second metal layer is 150 to 1000 nm,
a diffraction angle 2θ of a (111) plane in the second metal layer is less than 43.400° as measured using a CuKα ray as an X-ray source, and
the first metal layer has crystal properties different from those of the second metal layer.

2. The transparent conductive film according to claim 1, wherein
a diffraction angle 2θ of a (111) plane in the first metal layer as measured using a CuKα ray as an X-ray source is larger than that in the second metal layer.

3. The transparent conductive film according to claim 1, wherein
a thickness of the first metal layer is smaller than a thickness of the second metal layer, and the thickness of the first metal layer is 10 to 200 nm.

4. The transparent conductive film according to claim 1, wherein
the first metal layer is in contact with the transparent film substrate, and at least a surface of the transparent film substrate, which is in contact with the first metal layer, contains a polyester-based resin as a main component.

5. The transparent conductive film according to claim 1, wherein
the thin metal wire further includes an underlying metal layer containing Ni as a main component, between the transparent film substrate and the first metal layer, and the underlying metal layer and the first metal layer are in contact with each other.

6. A conductive film substrate comprising: a transparent film substrate; and a first metal layer and a second metal layer in this order on at least one surface of the transparent film substrate, wherein
one surface of the first metal layer is in contact with an underlay and another surface of the first metal layer is in contact with the second metal layer,
the underlay is a surface of the transparent film substrate containing at the surface thereof a polyester-based resin as a main component, or an underlying metal layer containing Ni as a main component,
the first metal layer and the second metal layer each contain copper in an amount of 90% by weight or more,
a total thickness of the first metal layer and the second metal layer is 150 nm to 1000 nm,
a diffraction angle 2θ of a plane in the second metal layer is less than 43.400° as measured using a CuKα ray as an X-ray source, and
the first metal layer has crystal properties different from those of the second metal layer.

7. The conductive film substrate according to claim 6, wherein
the second metal layer is patterned into a thin wire with a line width of 5 μm or less, and the first metal layer is not patterned.

8. A method for producing a transparent conductive film, the transparent conductive film including a transparent film substrate; and a transparent electrode layer composed of a patterned thin metal wire on at least one surface of the transparent film substrate, the method comprising:
a step of forming a first metal layer in contact with an underlay by a dry coating method;
a step of forming a second metal layer directly on the first metal layer by an electroplating method;
a step of forming a resist pattern having an opening width of 5 μm or less on the second metal layer;
a step of removing regions of the first metal layer and the second metal layer, which are not covered with the resist pattern, by etching to form a patterned thin metal wire having line width of 5 μm or less; and
a step of removing the resist pattern, wherein
the first metal layer and the second metal layer each contain copper in an amount of 90% by weight or more,
a total thickness of the first metal layer and the second metal layer is 150 to 1000 nm,
a diffraction angle 2θ of a plane in the second metal layer is less than 43.400° as measured using a CuKα ray as an X-ray source, and
the first metal layer has crystal properties different from those of the second metal layer.

9. A method for producing a transparent conductive film, the transparent conductive film including a transparent film substrate; and a transparent electrode layer composed of a patterned thin metal wire on at least one surface of the transparent film substrate, the method comprising:
a step of forming a first metal layer in contact with an underlay by a dry coating method;

a step of forming a resist pattern having an opening width of 5 μm or less on the first metal layer;

a step of forming a second metal layer directly on the first metal layer by an electroplating method, the second metal layer having line width of 5 μm or less being formed at an opening section in which the resist pattern is not formed;

a step of removing the resist pattern; and a step of removing the first metal layer at a region, on which the second metal layer is not formed, by etching to pattern the first metal layer, wherein the first metal layer and the second metal layer each contain copper in an amount of 90% by weight or more, a total thickness of the first metal layer and the second metal layer is 150 to 1000 nm, a diffraction angle 2θ of a (111) plane in the second metal layer is less than 43.400° as measured using a CuKα ray as an X-ray source, and the first metal layer has crystal properties different from those of the second metal layer.

10. The method for producing the transparent conductive film according to claim 8, wherein:

the underlay is an underlying metal layer containing Ni as a main component, the method further comprises a step of forming the underlying metal layer on the transparent film substrate, before forming the first metal layer.

11. The method for producing the transparent conductive film according to claim 9, wherein:

the underlay is an underlying metal layer containing Ni as a main component, the method further comprises a step of forming the underlying metal layer on the transparent film substrate, before forming the first metal layer.

12. The method for producing the transparent conductive film according to claim 10, wherein after the underlying metal layer is formed, the first metal layer is successively formed without exposing a surface of the underlying metal layer to the air.

13. The method for producing the transparent conductive film according to claim 8, wherein the dry coating method is a sputtering method.

14. The method for producing the transparent conductive film according to claim 9, wherein the dry coating method is a sputtering method.

15. The method for producing the transparent conductive film according to claim 11, wherein after the underlying metal layer is formed, the first metal layer is successively formed without exposing a surface of the underlying metal layer to the air.

16. The method for producing the transparent conductive film according to claim 8, wherein the underlay is a surface of the transparent film substrate containing a polyester-based resin as a main component at the surface thereof, and the first metal layer is directly formed on the surface of the transparent film substrate.

17. The method for producing the transparent conductive film according to claim 9, wherein the underlay is a surface of the transparent film substrate containing a polyester-based resin as a main component at the surface thereof, and the first metal layer is directly formed on the surface of the transparent film substrate.

* * * * *